US008040995B2

United States Patent
Fukushima

(10) Patent No.: US 8,040,995 B2
(45) Date of Patent: Oct. 18, 2011

(54) JITTER DETECTION CIRCUIT AND JITTER DETECTION METHOD

(75) Inventor: Nagayoshi Fukushima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 795 days.

(21) Appl. No.: 12/078,289

(22) Filed: Mar. 28, 2008

(65) Prior Publication Data
US 2008/0240328 A1 Oct. 2, 2008

(30) Foreign Application Priority Data

Mar. 30, 2007 (JP) ................................. 2007-092065

(51) Int. Cl.
*H03D 3/24* (2006.01)
*H04L 7/00* (2006.01)
(52) U.S. Cl. ........................................ 375/376; 375/354
(58) Field of Classification Search .................. 375/376, 375/371, 373, 354; 327/141
See application file for complete search history.

(56) References Cited

U.S. PATENT DOCUMENTS

| 5,828,255 A * | 10/1998 | Kelkar et al. | 327/157 |
| 6,130,566 A * | 10/2000 | Yokomizo | 327/175 |
| 2006/0132406 A1* | 6/2006 | Pan et al. | 345/89 |

FOREIGN PATENT DOCUMENTS

| JP | 10-267999 | 10/1998 |
| JP | 2003-179142 | 6/2003 |

\* cited by examiner

*Primary Examiner* — Dac Ha
*Assistant Examiner* — Brian J Stevens
(74) *Attorney, Agent, or Firm* — McGinn Intellectual Property Law Group, PLLC

(57) ABSTRACT

A jitter detection circuit includes an oscillation circuit, a measurement period setting circuit for outputting a measurement period signal based on a measurement period specifying signal, the measurement period setting circuit receiving the output clock from a PLL circuit, a counter for counting the number of clock cycles output from the oscillation circuit over the period during which the measurement period signal is being output, a reference count value determining circuit for setting a reference count value for the number of clock cycles output from the oscillation circuit over the period during which the measurement period signal is being output, and an error detection circuit for detecting the jitter error of the PLL circuit based on the maximum count value and minimum count value counted by the counter, and the reference count value.

16 Claims, 4 Drawing Sheets

JITTER DETECTION CIRCUIT AND JITTER DETECTION METHOD

BACKGROUND OF THE INVENTION

1. Field of the Invention

The present invention relates to a semiconductor device equipped with a jitter detection circuit and a jitter detection method thereof.

2. Description of Related Art

In recent years, as semiconductor components have gotten more miniaturized, an integrated circuit comprising those semiconductor components have been becoming larger in scale. Therefore, some of integrated circuits of recent years have a Phase-Locked Loop (PLL) circuit embedded within them. This PLL circuit is used not only to generate a clock signal used in the chip, but also to match the clock with the phase of an external clock.

Since this PLL circuit is a feedback circuit, the clock frequency can be varied depending on the stability. Jitter is one of these fluctuation widths as the clock phase is changed. When the fluctuation width of jitter is too large, it affects the operational stability of the integrated circuit which is synchronizing with the clock. Japanese Unexamined patent publication Nos. 10-267999 and 2003-179142 disclose techniques for measuring jitter in an integrated circuit having a PLL circuit.

In the technique disclosed in Japanese Unexamined patent publication No. 10-267999, a test input signal is input while varying the phase of the signal. Then, the test signal is latched in synchronization with a receive clock and output. The fluctuation width is measured by comparing the output signal with an expected output value.

The technique disclosed in Japanese Unexamined patent publication No. 2003-179142 introduces an embedded oscillation circuit called "window clock oscillation circuit". Using a delay circuit for the falling edge of the window clock signal to change as appropriate the time period during which clock cycles output from the PLL circuit is counted, jitter is examined based on the number of the falling edges of the clock signal output from the PLL circuit.

However, in the technique disclosed in Japanese Unexamined patent publication No. 10-267999, there is a problem that since it includes jitter caused by a test board extending to the PLL embedded circuit, it cannot accurately measure jitter caused by the embedded PLL circuit itself. Furthermore, in the technique disclosed in Japanese Unexamined patent publication No. 2003-179142, the characteristics of the delay circuit contained in the internal circuit varies depending on voltage, temperature, and the like. Consequently, the jitter measurement may be varied depending on the surrounding environment or the like, and therefore it is difficult to accurately measure jitter. In addition, in a circuit disclosed in Japanese Unexamined patent publication No. 2003-179142 or similar circuit, since the circuit itself is complicated, it increases the circuit scale.

In a conventional Jitter detection circuit, it is difficult to accurately measure the fluctuation rate of jitter with simple circuitry.

SUMMARY

In accordance with one aspect of the present invention, a jitter detection circuit comprises: an oscillation circuit; a measurement period setting circuit for outputting a measurement period signal based on a measurement period specifying signal, said measurement period setting circuit receiving the output clock from a PLL circuit; a counter for counting the number of clock cycles output from the oscillation circuit over the period during which the measurement period signal is being output; a reference count value determining circuit for setting a reference count value for the number of clock cycles output from the oscillation circuit over the period during which the measurement period signal is being output; and an error detection circuit for detecting the jitter error of the PLL circuit based on the maximum count value and minimum count value counted by the counter, and the reference count value.

In accordance with another aspect of the present invention, a jitter detection method comprises: setting a measurement period equivalent to the integral multiple of the PLL clock cycle; determining, by a oscillation circuit, a reference value for the number of clock cycles output during the single measurement period; counting, by the oscillation circuit, the number of clock cycles actually output during the single measurement period several times for several measurement periods; deriving the maximum count value and minimum count value from the count values obtained by the several counting; and detecting the jitter of the PLL clock based on the maximum count value, minimum count value, and the reference count value.

In accordance with one aspect, the present invention enables to accurately measure jitter using relatively simple circuitry. In addition, the present invention also enables to calculate jitter with very simple calculation.

BRIEF DESCRIPTION OF THE DRAWINGS

The above and other objects, advantages and features of the present invention will be more apparent from description of certain preferred embodiments taken in conjunction with the accompanying, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments which are illustrated for explanatory purposes.

Embodiments in accordance with the present invention are explained hereinafter with reference to the drawings.

First Embodiment

Figure 1:
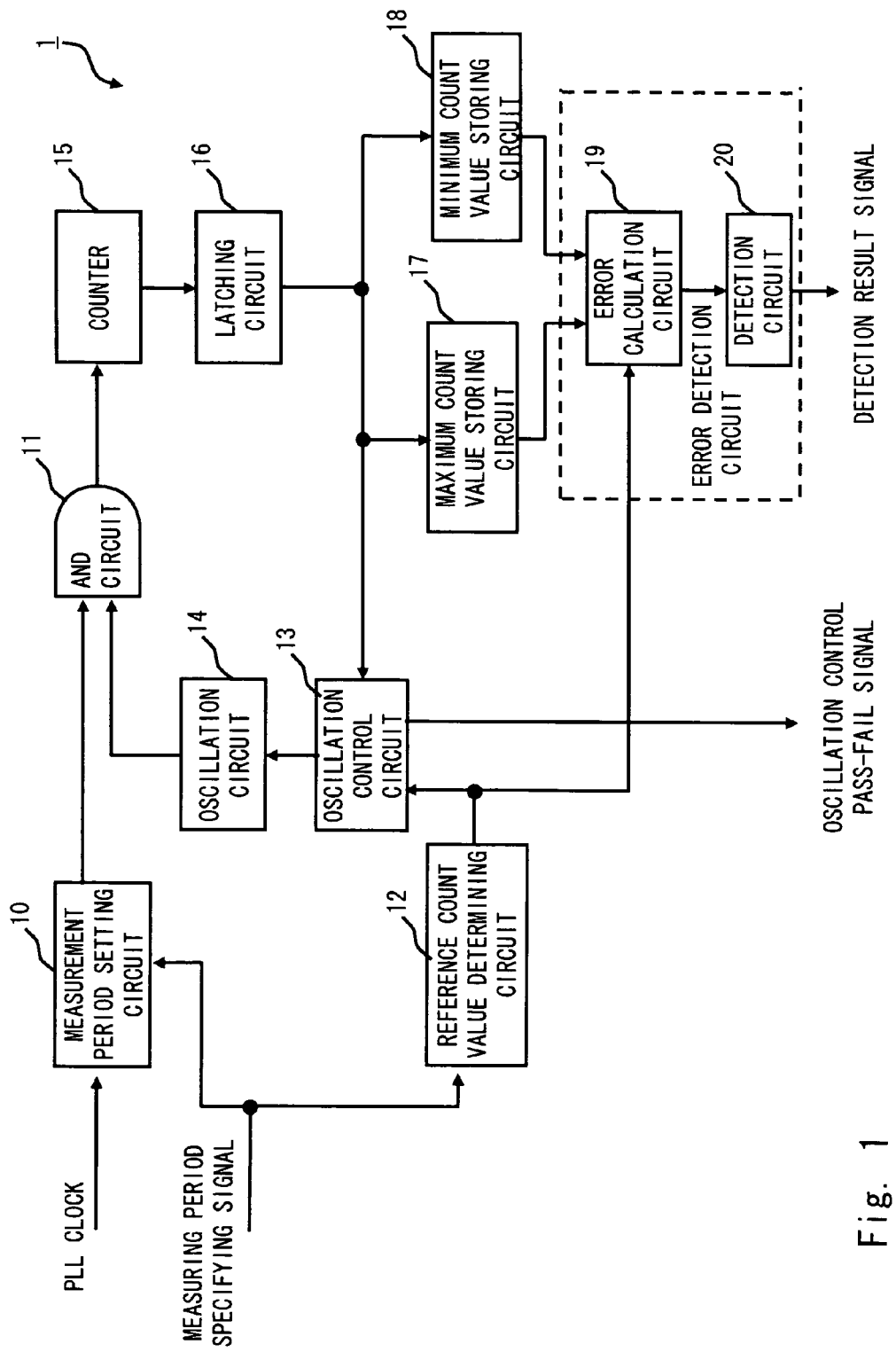
FIG. 1 is a block diagram of a jitter detection circuit in accordance with a first embodiment of the present invention.

FIG. 1 is a block diagram of a jitter measuring apparatus 1 in accordance with a first embodiment of the present invention. As shown in FIG. 1, the jitter measuring apparatus 1 in accordance with an embodiment of the present invention comprises a measuring period setting circuit 10, an AND circuit 11, a reference count value determining circuit 12, an oscillation control circuit 13, an oscillation circuit 14, a counter 15, a latching circuit 16, a maximum count value storing circuit 17, a minimum value storing circuit 18, an error calculation circuit 19, and a detection circuit 20. Furthermore, it also comprises a PLL circuit (not shown) for which the jitter is measured.

A measuring period specifying signal and a PLL clock output from the PLL circuit are input to the measuring period setting circuit 10. The measuring period setting circuit 10 outputs a signal indicating a measuring period based on the measuring period specifying signal. The measuring period specifying signal is a signal representing an integral multiple of a PLL clock cycle. For example, it is assumed that the value specified by the measuring period specifying signal is 35 times of a PLL clock cycle. The measuring period setting circuit 10 outputs a High level signal over the period of 35 PLL clock cycles and Low level over the remaining period.

The AND circuit 11 outputs a logical product of the output of the measuring period setting circuit 10 and the output of the oscillation circuit. In other words, it outputs the clock signal from the oscillation circuit 14 only when the measuring period setting circuit 10 is outputting High level indicating that it is in a measuring period.

The reference count value determining circuit 12 establishes a reference count value based on the measuring period setting signal. The term "reference count value" means a numerical value equivalent to $2^n$ determined based on the measuring period specifying signal and the oscillating frequency of the oscillation circuit 14.

The oscillation control circuit 13 compares the reference count value and the count value output through the counter 15 and latching circuit 16, and controls the oscillating frequency of the oscillation circuit 14 based on the comparison result. (The detail of the count value will be explained later.) The oscillation control circuit 13 controls the oscillating frequency of the oscillation circuit 14 such that the count value is equal to the reference count value. Furthermore, the oscillation control circuit 13 also outputs an external oscillation control pass-fail signal indicating whether the count value is equal to the reference count value or not.

The oscillation circuit 14 outputs a clock signal whose oscillating frequency varies based on the output of the oscillation control circuit 13. The clock signal output from the oscillation circuit 14 is input to the aforementioned AND circuit 11.

The counter 15 counts the number of AND output clock cycles output from the AND circuit. The counter 15 is reset to zero when, for example, the output of the measuring period setting circuit 10 which indicates the measuring period becomes High level. Then, the counter 15 counts the cycles of the AND output clock signal output from the AND circuit 11 until the output of the measuring period setting circuit 10 becomes Low level. The number of AND output clock cycles counted by the counter 15 are output to the latching circuit 16 as the count value. The number of AND output clock cycles counted by the counter 15 may be obtained from, for example, the number of rising edges (from Low to High) or falling edges (from High to Low) of the AND output clock. Furthermore, the number of the transitions (High to Low, Low to High) of a clock output from the counter 15 may be also used as the count value.

The latching circuit 16 holds the count value counted by the counter 15. The count value held at the latching circuit is output to the oscillation control circuit 13, the maximum count value storing circuit 17, and the minimum value storing circuit 18.

The maximum count value storing circuit 17 compares the count value held at the latching circuit 16 and the count value held at the maximum count value storing circuit 17. Then, if the count value held at the latching circuit 16 is larger than that of the maximum count value storing circuit 17, it stores the new count value. Meanwhile, if the count value held at maximum count value storing circuit 17 is larger than that of the latching circuit 16, it holds the original count value.

The minimum count value storing circuit 18 compares the count value held at the latching circuit 16 and the count value held at the minimum count value storing circuit 18. Then, if the count value held at the latching circuit 16 is smaller than that of the minimum count value storing circuit 18, it stores the new count value. Meanwhile, if the count value held at minimum count value storing circuit 18 is smaller than that of the latching circuit 16, it holds the original count value.

The error calculation circuit 19 calculates and outputs a jitter error based on the count values held at maximum count value storing circuit 17 and minimum count value storing circuit 18, and the reference count value output from the reference count value determining circuit 12. The detection circuit 20 makes a pass-fail evaluation for jitter and outputs the evaluation result based on the jitter error (fluctuation width) output from the error calculation circuit 19. The detection circuit 20 and error calculation circuit 19 constitute an error detection circuit.

Figure 2:
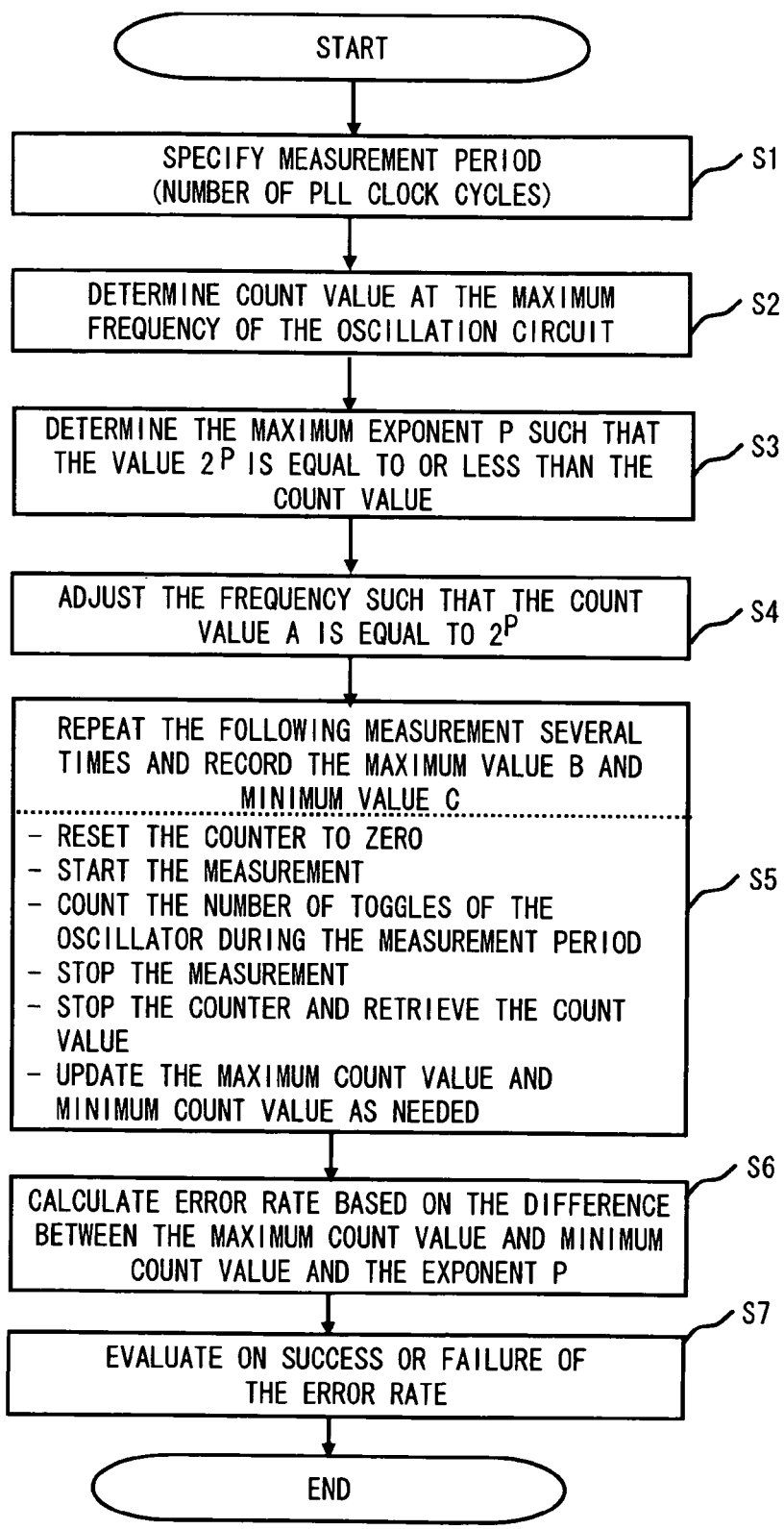
FIG. 2 is a flow diagram of a jitter measuring method performed by a jitter detection circuit in accordance with the present invention.

The operation of the Jitter detection circuit 1 in accordance with an embodiment of the present invention which is constructed in this manner is explained hereinafter. FIG. 2 is a flowchart showing the operation of a jitter detection circuit in accordance with an embodiment of the present invention. The operation of an embodiment in accordance with the present invention is explained hereinafter with reference to FIG. 2.

Firstly, at step S1 in FIG. 2, an external measuring period specifying signal is input to the Jitter detection circuit. The measuring period specifying signal specifies the number of PLL clock cycles. The measuring period setting circuit 10 outputs a High level signal for the period corresponding to the number of the PLL clock cycles based on the measuring period specifying signal.

Furthermore, the reference count value determining circuit 12 establishes a reference count value based on the measuring period specifying signal. The procedure for establishing the reference count value is explained hereinafter.

At step S2 in FIG. 2, the oscillating frequency of the oscillation circuit 14 is set to the maximum frequency. The measuring period setting circuit 10 outputs a High level signal for the period corresponding to the number of the PLL clock cycles based on the measuring period specifying signal while the oscillation circuit 14 keeps oscillating. In this state, the counter 15 counts the number of the AND output clock cycles.

At step S3 in FIG. 2, this count value is input to the reference count value determining circuit 12, and the reference count value determining circuit 12 determines the highest exponential value of 2 ($2^n$) equal to or less than this count value as a reference count value.

The procedure from step S1 to S3 is explained hereinafter using some exemplary values. In a following example, very small values are used for the simplicity of the explanation. However it should be understood that values in the order of several MHz or several GHz will be used in actual applications.

Firstly, assume that the measuring period specifying signal specifies, for example, 10 cycles of PLL clock as a measurement period at step S1. Also assume that the maximum oscillating frequency of the oscillation circuit 14 is equal to ten times the PLL clock. In this case, if the measurement period corresponds to 10 cycles of the PLL clock, the counter 15 counts the AND output clock cycles for 100 times. Therefore, the reference count value determining circuit 12 defines $2^6$=64 cycles (i.e., the highest exponential value of 2 ($2^n$) equal to or less than 100 cycles) as a reference count value. After the reference count value is established with this procedure, the Jitter detection circuit 1 in accordance with an embodiment of the invention proceeds to step S4 and following steps where an actual jitter detection operation is performed.

Incidentally, in an embodiment of the invention, in the case where the relation between an input PLL clock and the frequency of the oscillation circuit 14 is unknown, the oscillation circuit 14 oscillates at the maximum output frequency, and the reference count value is established based on the resulting count value counted by the counter 15. On the other hand, where the relation between an input PLL clock and the frequency of the oscillation circuit 14 is known or in a similar situation, the oscillation control circuit 13 does not necessarily need to control the oscillating frequency. In this case, the reference count value determining circuit 12 may be merely a circuit for holding the reference count value based on the relation with the known frequency.

At step S4 in FIG. 2, the measuring period setting circuit 10 outputs a signal indicating a measurement period equivalent to the period specified at step S2. At this point, the oscillation control circuit 13 adjusts the oscillation circuit 14 such that the oscillating frequency becomes the frequency determined by the reference count value determining circuit 12. At following step S5, an assumption is made that the control signal output from the oscillation control circuit 13 to the oscillation circuit 14 is a fixed signal.

Then, at step S5, the oscillation control circuit 13 outputs the fixed signal determined at above step S4 for controlling the oscillation circuit 14. At step S5, a counting action in which the number of the AND output clock cycles (the number of clock cycles actually output from the oscillation circuit 14) is counted over the period during which the signal indicating a measurement period is active is repeated several times.

In other words:
1. The measuring period setting circuit changes to a High level;
2. The counter 15 is reset to zero;
3. The counting of the AND output clock cycles starts;
4. The measuring period setting circuit changes to a low level; and
5. The counting stops.

These actions are repeated several times. Then, whenever this series of actions finishes, the count number of the AND output clock cycles counted by the counter 15 is output to the latching circuit 16.

The count value output to the latching circuit 16 is compared with the maximum count value and minimum count value stored in the maximum count value storing circuit 17 and the minimum count value storing circuit 18 respectively. If the count value held at the latching circuit is the maximum count value, the count value stored in the maximum count value storing circuit 17 is updated, and if the count value held at the latching circuit is the minimum count value, the count value stored in the minimum count value storing circuit 18 is updated.

Then, after this counting during a measuring period is repeated several times to determine the maximum count value and minimum count value at step S5, the procedure proceeds to step S6.

At step S6, the jitter fluctuation width is calculated from the difference between the maximum count value and minimum count value determined at step S5. In other words, if there is a difference among the count values of the AND output clock cycles even though the measuring period setting signal establishes the identical measurement period at all times, it means that the PLL clock has jitter corresponding to the difference among the count values. An embodiment in accordance with the present invention calculates the jitter error rate using this theory. In particular, this calculating is expressed by the following calculation:

(Maximum count value−Minimum count value)/Reference count value.

The calculated error rate is output to the detection circuit 20, and the detection circuit 20 determines the error rate as "pass" when the error is within a tolerance level, and determines it as "fail" when the error is outside of the tolerance level.

In accordance with an embodiment, with this manner, the present invention establishes a measurement period corresponding to the number of PLL clock cycles with a measuring period specifying signal, and uses the maximum count value and minimum count value of AND output clock cycles based on clock output from the oscillation circuit 14 during the measurement period to determines a jitter error rate. Therefore, it enables to measure a jitter error rate without using a conventional large scale circuit or the like. Furthermore, unlike conventional delay circuits or the like, it also allows the stable jitter measurement of a PLL clock independent of a voltage condition, a temperature condition, and impurity diffusion during manufacture.

Second Embodiment

Figure 3:
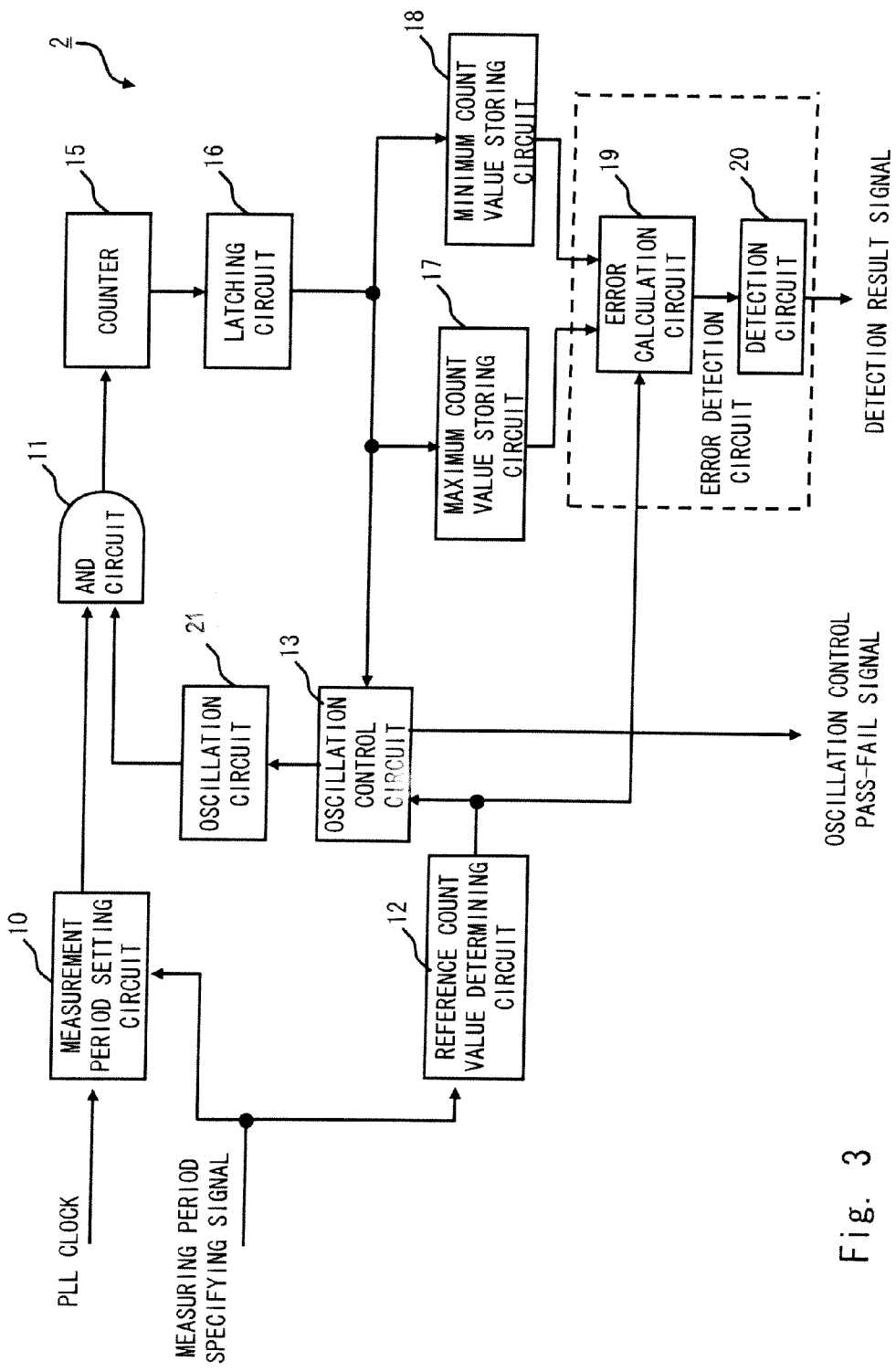
FIG. 3 is a block diagram of a jitter detection circuit in accordance with a second embodiment of the present invention.

FIG. 3 is a block diagram of a jitter measuring apparatus 3 in accordance with a second embodiment of the present invention. In FIG. 3, the same numerical symbols are assigned to components common to those of FIG. 1, and detailed explanations for those components are omitted.

The second embodiment is different from the first embodiment in that an oscillation circuit 21 can be suspended by an external signal. The oscillation circuit 21 stops the oscillation when an external oscillation stop signal is input. This external oscillation stop signal is input from, for example, an external control circuit controlling a jitter detection circuit 2 in accordance with the present invention.

In the circuit operation, the jitter measurement of a PLL circuit is not necessarily performed continuously. For example, the jitter measurement may be performed with certain intervals. Therefore, in the second embodiment, an oscillation stop signal is output over the interval during which the jitter measurement is not performed. In the second embodiment, the oscillation circuit 21 is suspended over the period during when the oscillation stop signal is being input. Therefore, it enables to decrease unnecessary power consumption due to the oscillation of the oscillation circuit.

Third Embodiment

Figure 4:
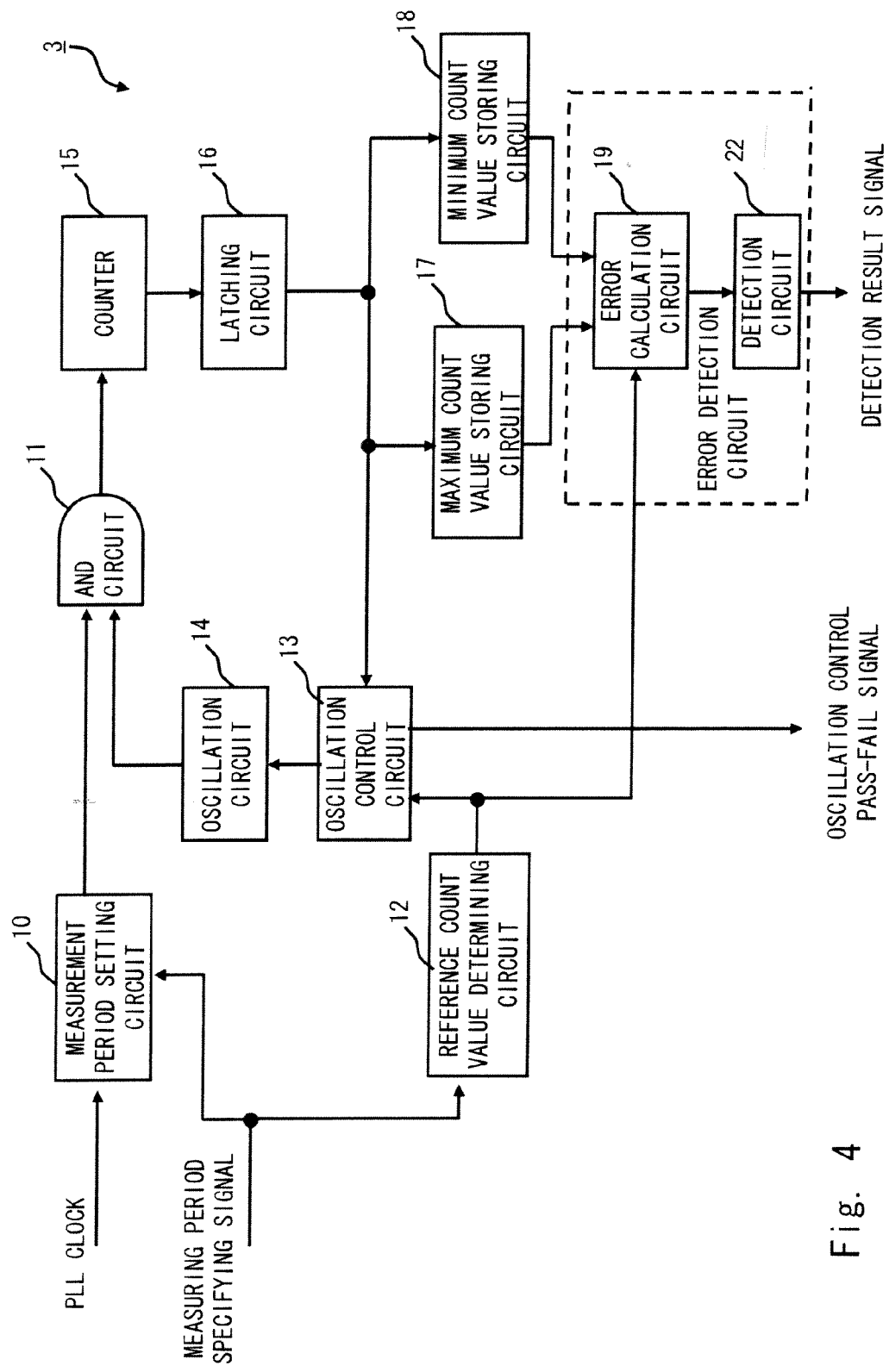
FIG. 4 is a block diagram of a jitter detection circuit in accordance with a third embodiment of the present invention.

FIG. 4 is a block diagram of a jitter measuring apparatus 2 in accordance with a third embodiment of the present invention. In FIG. 4, the same numerical symbols are assigned to components common to those of FIG. 1, and detailed explanations for those components are omitted.

The third embodiment is different from the first embodiment in that the output of a reference count value determining circuit 12 is input to a detection circuit 22. As explained with the first embodiment, any reference points such as the rising edges and falling edges of the clock signal output from AND circuit 11 can be used by the counter 15 to count the number of AND clock cycles. In these cases, there is a possibility that the counter 15 has an error from the actual number of clock cycles owning to the difference between the timing when the measuring period setting circuit 10 starts to output a signal indicating the start of measurement time based on the PLL clock and the transition timing of the output clock from the oscillation circuit 14. For example, in the case where the counter 15 counts the rising edges of the AND output signal, there is a possibility that the number of the AND output signal counted by the counter 15 is one cycle fewer than the actual number when the rising edge of the output clock signal from the oscillation circuit 14 and the rising edge of the signal indicating the start of the measurement period occur at substantially the same time.

Therefore, in the third embodiment, the reference count value is input to the detection circuit 22 so that it enables the jitter pass-fail evaluation taking account of the error of the counter 15 based on the reference count value.

The present invention has been explained in detail with the reference to the embodiments. However, it should be understood that the present invention is not limited to those embodiment, and various modifications are apparent to those having skill in the art without departing from the spirit and scope of the present invention. For example, a jitter detection circuit may be constructed by combining the features of each embodiment.

It is apparent that the present invention is not limited to the above embodiments, but may be modified and changed without departing from the scope and spirit of the invention.

What is claimed is:

1. A jitter detection circuit comprising:
   an oscillation circuit;
   a measurement period setting circuit outputting a measurement period signal based on a measurement period specifying signal, said measurement period setting circuit receiving the output clock from a PLL (Phase-Locked Loop) circuit;
   a counter counting a number of clock cycles output from said oscillation circuit over a measured period of time during which said measurement period signal is being output;
   a reference count value determining circuit setting a reference count value for the number of clock cycles output from said oscillation circuit over the measured period of time during which said measurement period signal is being output; and
   an error detection circuit detecting the jitter error of said PLL circuit based on the maximum count value and minimum count value counted by said counter, and said reference count value.

2. The jitter detection circuit of claim 1 further comprising an oscillation control circuit controlling the oscillating frequency of said oscillation circuit based on the reference count value established by said reference count value determining circuit.

3. The jitter detection circuit of claim 2, wherein when a relation between an input PLL clock of the PLL circuit and the frequency of the oscillation circuit is known, the oscillation control circuit does not control the oscillating frequency, and the reference count value determining circuit holds the reference count value based on a relation with a known frequency.

4. The Jitter detection circuit of claim 1 wherein said measuring period signal is output several times, and said counter responds to each of said measuring period specifying signal output several times and counts the number of clock cycles output from said oscillation circuit for several times.

5. The Jitter detection circuit of claim 4 further comprising a maximum count value storing circuit for holding the maximum count value among the several count values counted by said counter, and a minimum count value storing circuit holding the minimum count value among the several count values counted by said counter.

6. The Jitter detection circuit of claim 1 wherein said oscillation circuit stops the oscillation based on an oscillation stop signal.

7. The jitter detection circuit of claim 1, wherein the error detection circuit detects the jitter error of said PLL circuit according to the following:

(maximum count value−minimum count value)/reference count value.

8. The jitter detection circuit of claim 1, wherein when a relation between an input PLL clock of the PLL circuit and a frequency of the oscillation circuit is unknown, the oscillation circuit oscillates at the maximum output frequency, and the reference count value is established based on the resulting count value counted by the counter.

9. The jitter detection circuit of claim 1, wherein a counting during the measured period of time is repeated a plurality of times to determine the maximum count value and minimum count value.

10. The jitter detection circuit of claim 9, wherein the maximum count value and minimum count value is derived from the count values obtained by said counting of clock cycles to determine fluctuation of the jitter.

11. The jitter detection method comprising:
    setting a measurement period equivalent to the integral multiple of the PLL (Phase-Locked Loop) clock cycle;
    determining, by an oscillation circuit, a reference count value for the number of clock cycles output during a single measurement period of time;
    counting, by said oscillation circuit, the number of clock cycles actually output during said single measurement period of time several times for several measurement periods of time;
    deriving the maximum count value and minimum count value from the count values obtained by said several counting; and
    detecting the jitter of the PLL clock based on said maximum count value, said minimum count value, and said reference count value.

12. The Jitter detection method of claim 11 wherein said reference count value is an exponential value of 2.

13. The Jitter detection method of claim 11 wherein said decision of the jitter is performed by dividing the difference between said maximum count value and said minimum count value by said reference count value.

14. The jitter detection method of claim 11, wherein the error detection circuit detects the jitter error of said PLL circuit according to the following:

(maximum count value−minimum count value)/reference count value.

15. The jitter detection method of claim 11, wherein when a relation between an input PLL clock of the PLL circuit and a frequency of the oscillation circuit is unknown, the oscillation circuit oscillates at the maximum output frequency, and the reference count value is established based on the resulting count value counted by the counter.

16. The jitter detection method of claim 11, wherein when a relation between an input PLL clock of the PLL circuit and the frequency of the oscillation circuit is known, the oscillation control circuit does not control the oscillating frequency, and the reference count value determining circuit holds the reference count value based on a relation with a known frequency.

* * * * *